United States Patent
Lee et al.

(10) Patent No.: US 6,991,989 B2
(45) Date of Patent: Jan. 31, 2006

(54) PROCESS OF FORMING HIGH-K GATE DIELECTRIC LAYER FOR METAL OXIDE SEMICONDUCTOR TRANSISTOR

(75) Inventors: Lurng-Shehng Lee, Hsinchu (TW);
Pei-Jer Tzeng, Hsinchu (TW);
Chih-Sheng Kuo, Hsinchu (TW);
Jenn-Gwo Hwu, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 10/838,343

(22) Filed: May 5, 2004

(65) Prior Publication Data

US 2005/0158940 A1    Jul. 21, 2005

(30) Foreign Application Priority Data

Jan. 20, 2004  (TW) ............................ 93101551 A

(51) Int. Cl.
*H01L 21/336*  (2006.01)
(52) U.S. Cl. ........................ 438/287; 438/785

(58) Field of Classification Search ................ 438/216, 438/287, 591, 785
See application file for complete search history.

(56) References Cited

U.S. PATENT DOCUMENTS

| | | | |
|---|---|---|---|
| 6,020,024 A * | 2/2000 | Maiti et al. .................. | 438/287 |
| 6,420,279 B1 * | 7/2002 | Ono et al. .................... | 438/785 |
| 6,559,051 B1 | 5/2003 | Buynoski et al. ........... | 438/678 |
| 2003/0049942 A1 * | 3/2003 | Haukka et al. ............. | 438/778 |

* cited by examiner

*Primary Examiner*—Chandra Chaudhari
(74) *Attorney, Agent, or Firm*—Birch, Stewart, Kolasch & Birch, LLP

(57) ABSTRACT

A process of forming a high-k gate dielectric layer is applied in forming semiconductor devices such as metal oxide semiconductor transistor or memory devices. A metal layer such as Hf or Zr is formed on a substrate. The substrate is then dipped in an acidic solution such as a nitric acid aqueous solution to form a high-K metal oxide layer including oxides or silicate with a predetermined thickness. Thereby, leakage current is effectively reduced to meet the requirement of currently technology nodes.

13 Claims, 2 Drawing Sheets

PROCESS OF FORMING HIGH-K GATE DIELECTRIC LAYER FOR METAL OXIDE SEMICONDUCTOR TRANSISTOR

FIELD OF THE INVENTION

This Non-provisional application claims priority under 35 U.S.C. § 119(a) on Patent Application No(s) . 093101551 filed in Taiwan on Jan. 20, 2004, the entire contents of which are hereby incorporated by reference.

The present invention relates to a process of forming a dielectric layer, applied in a process of forming a metal oxide semiconductor transistor or memory device, and more particularly to a process of forming a high-k gate dielectric layer for a metal oxide semiconductor transistor which prevents leakage current.

BACKGROUND OF THE INVENTION

In the past thirty years, an integrated circuit (IC) has increased 100,000 times the memory capacity and 2,000 times the logic operational speed. This happened, due to the increasingly reduced dimension of its main component metal oxide semiconductor field effect transistor (MOSFET), the increase in memory capacity and a logic operational speed far beyond expectation.

However, when the dimension of the CMOS device reduces to reach a technology node below 45 nm~65 nm, a gate dielectric layer must be thin, about 1.2 nm~1.5 nm, in order to keep a considerable gate capacitance and reduce the power consumption of a single device with a substantially small leakage current. A conventional gate dielectric layer is made of $SiO_2$. When the $SiO_2$ dielectric layer has the above thickness, direct tunneling will occur to lead to a duly high leakage current, which is in contrast to the feature's trend.

As a high-k gate dielectric material, $HfO_2$ or $ZrO_2$ is potentially advantageously used. However, the crystallization temperature is not high, about 700° C., which is adversely affected by high temperature during the formation of the device and thus the properties of the device are deteriorated, due to crystallization. Adding elements such as Al, N or Si into the dielectric material has made an improvement. A typical Physical Vapor Deposition (PVD) usually sputters over a constant-composition substrate or a plurality of different substrates. Oxygen plasma used in the deposition process tends to react with the silicon substrate to form an interfacial oxide. In a Chemical Vapor Deposition (CVD) process, doping those elements is difficult, and therefore there is a need to find a complex precursor. Impurities such as Cl, generated at the same time the complex precursor has been formed, are removed by using high-temperature annealing, which may increase the thickness of the dielectric layer. In order to overcome the above problems, dry oxidation over Hf metal or low-temperature plasma oxidation is used.

The formation of the dielectric layer in the transistor has been well disclosed in, for example, U.S. Pat. No. 6,559,051. In '051, electroless plating that uses a precursor-containing solution to form a metal thin layer is performed, and then oxidation is performed. However, such a method allows oxygen ions in the solution to contact the silicon substrate at the beginning to form oxides that increase the thickness of the dielectric layer.

SUMMARY OF THE INVENTION

In order to solve the above prior problems, the invention provides a process of forming a high-K gate dielectric layer in a metal oxide semiconductor transistor, in which leakage current is reduced, extra thermal budget is prevented and an interfacial layer between a high-K layer and a substrate is prevented while a gate dielectric layer is having a substantial thickness, so that the transistor formed by the invention meets the requirements for the technology node.

According to the process of the invention, metals such as Hf, Zr are formed on a Si substrate to form a metal layer. The substrate is dipped in an acidic solution such as a nitric acid solution, to oxidize the metal layer, to form a high-k metal oxide layer including metal oxides, silicon metal oxides, etc. A high-temperature annealing process is performed to remove any impurities in the high-k metal oxide layer, to form a conductive layer as a gate dielectric layer. Finally, etching and ion doping are subsequently performed to form a source and a drain. Thereby, a semiconductor device is accomplished.

It will be understood that the foregoing summary encompasses some of the many features of the invention, and does not constitute an exhaustive description of all the aspects of the invention. Therefore, the summary of the invention should not be construed in a way to limit the scope of the invention as described in the claims. To provide a further understanding of the invention, the following detailed description illustrates embodiments and examples of the invention.

DETAILED DESCRIPTION OF THE PREFERRED EMBODIMENTS

The following description of the present invention is intended to be illustrative only and not limiting.

The process of forming a dielectric layer for a high-k gate in a metal oxide semiconductor according to the invention can be applied in a process of forming a semiconductor device, such as a metal oxide semiconductor transistor or a memory device.

Figure 1:
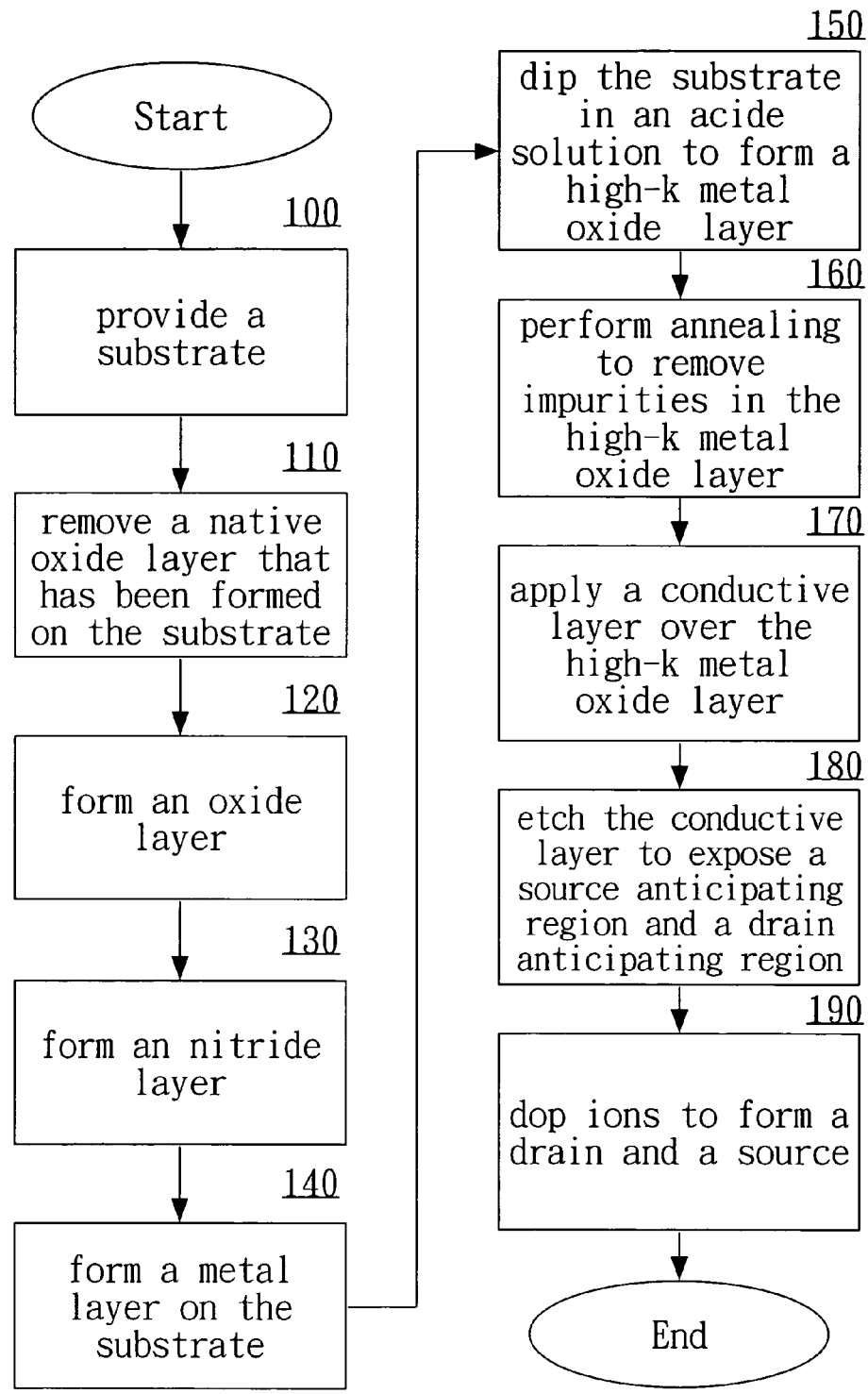
FIG. 1 through FIG. 3 are schematic views illustrating a process of forming a dielectric layer, applied in a process of forming a high-k gate dielectric layer in a metal oxide semiconductor transistor according to one embodiment of the invention.
Figure 2:
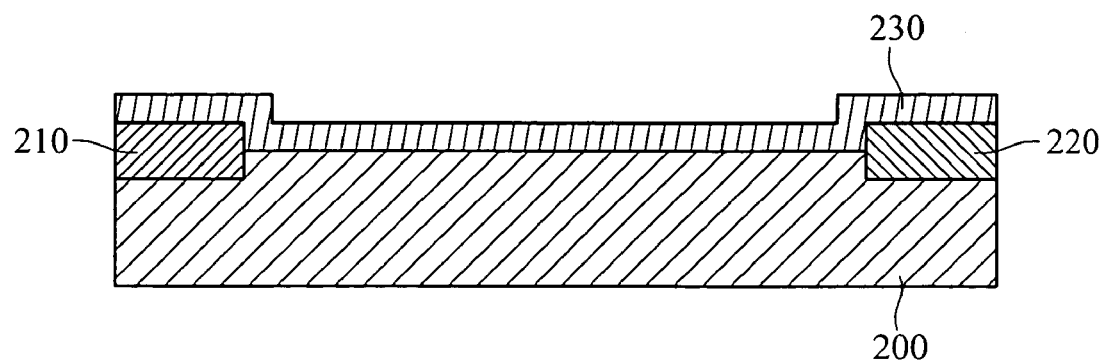
Figure 3:
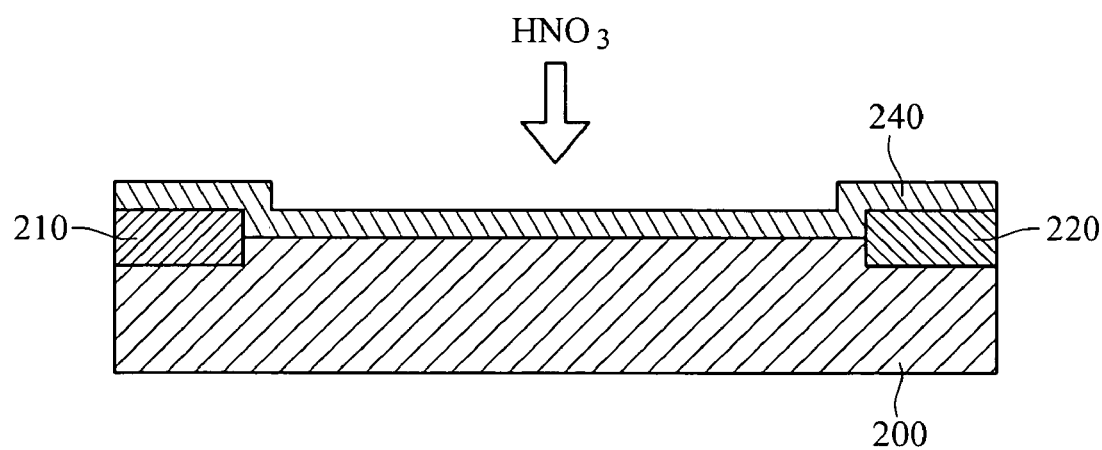

Referring to FIG. 1, a substrate 200 is provided (step 100). The substrate can be, for example, Si, strained Si, SiGe, Ge, IIIB-group elements, IVB-group elements, or VB-group elements. A native oxide that has been formed over a surface of the substrate is removed (step 110). A very thin oxide layer is formed (step 120). Nitrogenization is performed to form a nitride layer (step 130). Referring to FIG. 2, the substrate 200 has a source anticipating region 210 and a drain anticipating region. A metal layer 230 is formed on the substrate 200 by Chemical Vapor Deposition (CVD), Physical Vapor Deposition (PVD), Molecular Beam Epitaxy (MBE), anode plating or electroless plating (step 140). The metal layer 230 has a thickness of about 3 angstroms to 60, and can be, for example, Hf, Zr, La, or Y. Referring to FIG. 3, the substrate is dipped into an acidic solution. The acidic solution is, but not limited to, a nitric acid aqueous solution of a concentration greater than 0.1. The nitric acid that is an oxidant oxidizes the metal layer 230, to form a high-k metal oxide layer 240 (step 150). The high-k metal oxide layer 240 includes an oxide or silicon oxide, such as $HfO_2$, $ZrO_2$, $La_2O_3$, $Y_2O_3$, HfSiO, or ZrSiO. Then high-temperature annealing is performed to remove any impurities in the high-k metal oxide layer 240 (step 160). A conductive layer is formed on the high-k metal oxide layer (step 170). The conductive layer can be, for example, polysilicon or metals. The metal etching or poly etching is performed on the conductive layer to expose the source anticipating region and the drain anticipating region of the substrate (step 180). Finally, ions are doped to form a source and a drain (step 190). Thereby, a metal oxide semiconductor transistor is accomplished.

As described above, the process of forming a dielectric layer for a high-k gate in a metal oxide semiconductor according to the invention provides at least the following advantages:

1. Reduced leakage current: The thickness of the high-k metal oxide layer formed by the process of the invention is thicker than the prior art, but the effective thickness (ET) of the high-k metal oxide layer formed by the process of the invention is thinner than the prior art, therefore the leakage current is reduced and thus meet the requirement for a gate dielectric layer.

2. Prevention of extra thermal budget: The acidic solution is used in low-temperature growth environment to effectively prevent extra thermal budget.

3. Prevention of the interfacial layer between the high-k layer and the substrate: Since the thermal budget is generated, the interfacial layer that is possibly formed between the high-k layer and the substrate is reduced.

Those skilled in the art will readily understand that the above description is only illustrative of specific embodiments and examples of the invention, which should not be construed in a limiting way. Therefore, the invention should cover various modifications and variations made to the structure and operations described herein, provided they fall within the scope of the invention as defined in the following appended claims.

What is claimed is:

1. A process of forming a high-K gate dielectric layer in a metal oxide semiconductor transistor, the process comprising:
   a). providing a substrate, the step of providing the substrate including:
   a1). removing a native oxide layer that has been formed on the substrate;
   a2). forming an oxide layer on the substrate; and
   a3). forming a nitride layer on the oxide layer;
   b). forming a metal layer on the nitride layer;
   c). dipping the substrate in an acidic solution to form a high-k metal oxide layer;
   e). applying a conductive material over the high-k metal oxide layer;
   f). etching the conductive layer to expose a source anticipating region and a drain anticipating region; and
   g). doping ions to form a drain and a source.

2. The process of claim 1, wherein the material of the substrate is one selected from the group consisting of Si, strained Si, SiGe, Ge, IIIB-group elements, IVB-group elements and VB-group elements.

3. The process of claim 1, wherein the material of metal layer is one selected from the group consisting of Hf, Zr, La and Y.

4. The process of claim 1, wherein the material of the high-k metal oxide layer is one selected from the group consisting of HfO2, ZrO2, La2O3, Y2O3, HfSiO and ZrSiO.

5. The process of claim 1, wherein the metal layer has a thickness of about 3 angstroms and 60 angstroms.

6. The process of claim 5, wherein the acidic solution is a nitric acid aqueous solution of a concentration of more than 0.1%.

7. The process of claim 1, wherein the step b) is performed by one of CVD, PVD, MBE, anode plating and electroless plating to form the metal layer.

8. The process of claim 1, wherein the conductive layer is formed of metals or polysilicon.

9. The process of claim 1, wherein the process is applied to form a memory device.

10. The process of claim 1, wherein after the step c), a high-temperature annealing is performed to remove impurities in the high-K metal oxide layer.

11. The process of claim 1, wherein the step a2) includes forming the oxide layer to contact a top surface of the substrate.

12. The process of claim 11, wherein the step a3) includes forming the nitride layer to contact a top surface of the oxide layer.

13. The process of claim 1, wherein the step a3) includes forming the nitride layer to contact a top surface of the oxide layer.

* * * * *